United States Patent
Winters et al.

(10) Patent No.: US 7,554,261 B2
(45) Date of Patent: Jun. 30, 2009

(54) ELECTRICAL CONNECTION IN OLED DEVICES

(75) Inventors: Dustin L. Winters, Webster, NY (US); Gary Parrett, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 467 days.

(21) Appl. No.: 11/429,615

(22) Filed: May 5, 2006

(65) Prior Publication Data

US 2007/0257606 A1 Nov. 8, 2007

(51) Int. Cl.
*H01L 51/50* (2006.01)
(52) U.S. Cl. .................. 313/503; 313/500; 313/505
(58) Field of Classification Search ......... 313/500–512; 257/40, 79, 88, 89; 315/169.3
See application file for complete search history.

(56) References Cited

U.S. PATENT DOCUMENTS

| | | | |
|---|---|---|---|
| 4,356,429 A | 10/1982 | Tang | |
| 5,276,380 A | 1/1994 | Tang | |
| 5,550,066 A | 8/1996 | Tang et al. | |
| 5,684,365 A | 11/1997 | Tang et al. | |
| 6,278,237 B1 | 8/2001 | Campos | |
| 6,281,634 B1 | 8/2001 | Yokoyama | |
| 6,392,340 B2 | 5/2002 | Yoneda et al. | |
| 6,456,013 B1 | 9/2002 | Komiya et al. | |
| 6,501,466 B1 | 12/2002 | Yamagishi et al. | |
| 6,512,504 B1 * | 1/2003 | Yamauchi et al. | 315/169.3 |
| 6,522,079 B1 | 2/2003 | Yamada | |
| 6,535,185 B2 | 3/2003 | Kim et al. | |
| 6,674,245 B2 | 1/2004 | Ko et al. | |
| 6,714,178 B2 | 3/2004 | Koyama et al. | |
| 6,724,149 B2 | 4/2004 | Komiya et al. | |
| 6,737,800 B1 | 5/2004 | Winters et al. | |
| 6,753,654 B2 | 6/2004 | Koyama | |
| 6,762,564 B2 | 7/2004 | Noguchi et al. | |
| 6,771,028 B1 | 8/2004 | Winters | |
| 6,798,145 B2 | 9/2004 | Ishizuka | |
| 6,919,681 B2 | 7/2005 | Cok et al. | |
| 2001/0043168 A1 | 11/2001 | Koyama et al. | |
| 2003/0076046 A1 | 4/2003 | Komiya et al. | |
| 2003/0216100 A1 | 11/2003 | Lee et al. | |
| 2004/0160170 A1 | 8/2004 | Sato et al. | |
| 2004/0183083 A1 | 9/2004 | Koo | |
| 2005/0116232 A1 | 6/2005 | Kim et al. | |
| 2005/0162580 A1 | 7/2005 | Kim et al. | |
| 2005/0179374 A1 | 8/2005 | Kwak | |
| 2005/0218798 A1 | 10/2005 | Chang | |

FOREIGN PATENT DOCUMENTS

EP 1 049 176 11/2000

\* cited by examiner

*Primary Examiner*—Mariceli Santiago
(74) *Attorney, Agent, or Firm*—Raymond L. Owens (57) ABSTRACT

An electroluminescent display device comprising a plurality of pixels for generating light emission disposed over a substrate arranged in a matrix with rows and columns wherein each pixel includes first and second electrodes, an electroluminescent media disposed between the first and second electrodes, and at least one transistor electrically connected to the first electrode to regulate an electrical current flow to the organic electroluminescent media; a plurality of power lines arranged in either the row or column direction for supplying electrical current to the transistor of each pixel; at least one power bypass line electrically connected to two or more of the plurality of power lines; and the power lines formed from a patterned first conductor layer and the first electrodes and the power bypass lines formed from a patterned second conductor layer and wherein the first and second conductor layers are spaced apart from each other.

5 Claims, 4 Drawing Sheets

ELECTRICAL CONNECTION IN OLED DEVICES

CROSS REFERENCE TO RELATED APPLICATIONS

The present application is related to U.S. Ser. No. 11/005,745, filed on Dec. 7, 2004, by Dustin L. Winters and Steven A. Van Slyke, entitled "OLED Displays With Varying Sized Pixels", and U.S. Ser. No. 11/341,945, filed on Jan. 27, 2006, by Ronald S. Cok and Michael E. Miller, entitled "EL Device Having Improved Power Distribution".

FIELD OF INVENTION

This invention relates to forming electrical connection between a power line and a power bypass line in an OLED device.

BACKGROUND OF THE INVENTION

In the simplest form, an organic electroluminescent (EL) device is comprised of organic electroluminescent media disposed between first and second electrodes. The first and second electrodes serve as an anode for hole injection and a cathode for electron injection. The organic electroluminescent media supports recombination of holes and electrons that yields emission of light. These devices are also commonly referred to as organic light-emitting diodes, or OLEDs. A basic organic EL element is described in U.S. Pat. No. 4,356,429. In order to construct a pixelated OLED display device that is useful as a display such as, for example, a television, computer monitor, cell phone display, personal digital assistant display, music player display, or digital camera display, individual organic EL elements can be arranged as pixels in a matrix pattern. These pixels can all be made to emit the same color, thereby producing a monochromatic display, or they can be made to produce multiple colors such as a three-pixel red, green, blue (RGB) display. For purposes of this disclosure, a pixel is considered the smallest individual unit, which can be independently stimulated to produce light. As such, the red pixel, the green pixel, and the blue pixel are considered as three distinct pixels.

The simplest pixelated OLED displays are driven in a passive matrix configuration. In a passive matrix, the organic EL material is sandwiched between two sets of electrodes, arranged orthogonally as rows and columns. An example of a passive matrix driven OLED display is described in U.S. Pat. No. 5,276,380. This approach to producing a pixelated display, however, has several disadvantages. First, only a single row (or column) is illuminated at any given time. Therefore, in order to achieve the desired average brightness for a given frame of video, the row should be illuminated to an instantaneous brightness equal to the desired average brightness multiplied by the number of rows. This results in higher voltages and reduced long term reliability compared to a situation where the pixels are capable of being lit continuously for the entire frame. Second, the combination of high instantaneous current and electrodes that are long and narrow, and therefore have high resistance, results in significant voltage drops across the device. These variations in voltage across the display adversely affect brightness uniformity. These two effects become worse as the size of the display and number of rows and columns are increased, thereby limiting the usefulness of passive matrix designs to relatively small, low resolution displays.

To resolve these problems and produce higher performance devices, OLED displays driven by active matrix (AM) circuitry have been shown. In an active matrix configuration, each pixel is driven by multiple circuit elements such transistors, capacitors, and signal lines. This circuitry permits the pixels of multiple rows to remain illuminated simultaneously, thereby decreasing the required peak brightness of each pixel. Examples of active matrix drive OLED displays are shown in U.S. Pat. Nos. 5,550,066, 5,684,365, 6,281,634, 6,456,013, 6,501,466, 6,535,185, 6,737,800 and 6,392,340, 6,753,654 and 6,798,145 and U.S. Patent Application Numbers 2005/0218798A1 and 2003/0216100A1.

The active matrix circuitry is commonly achieved by forming thin film transistors (TFT's) from thin layers of semiconductor material, such as silicon, deposited onto the substrate. The two most common types of TFT's are amorphous silicon type TFT's and polysilicon type TFT's. These TFT's are commonly fabricated using thin film deposition, photolithographic patterning, and etching techniques known in the art. Each layer of the TFT is built up using one or more, and often all three, of these techniques. Amorphous silicon TFT's are constructed by using a silicon layer with an amorphous structure. As such they tend to have low performance in terms of the their ability to conduct and are typically limited to n-type transistors, also known as NMOS. Polysilicon type TFT's are fabricated by annealing amorphous silicon at elevated temperatures to crystallize the silicon layer into a poly-crystalline state. As such, polysilcon type TFT's have better performance and can also be fabricated into both n-type (NMOS) and p-type (PMOS) transistors. A common method of annealing polysilicon type TFT's is by excimer laser annealing (ELA). However, the additional processing steps required to anneal the polysilicon and fabricate both NMOS and PMOS type transistors typically result in such polysilicon type devices having a high manufacturing cost.

In addition to the silicon layers, several conductor and insulator layers are typically deposited and patterned to complete the TFT's as well as the wiring and other components such as capacitors. Commonly, two different conductor layers are used in the fabrication of the TFT wiring. The conductor layers are used to form the gate terminal and the source and drain terminal connections to the TFT's. In addition, these two conductor layers also form an orthogonal grid of wiring in a row direction and a column direction. Since two spaced apart conductor layers are used with at least one insulator layer in between, the row wiring and the column wiring can be formed and electrically isolated from one and other. Typically, data signal lines are formed in one of these two conductor layers while row select lines are formed in the other conductor layer. This allows the pixels to be selected, for example row by row, while the brightness intensity data is loaded from the column direction. These conductor layers are typically formed of highly conductive materials such as chromium, molybdenum, aluminum, aluminum alloys such as aluminum neodymium, or the like.

Since OLED devices require a constant current supply to sustain illumination, active matrix OLED devices typically provide a power line electrically connected to a voltage source to supply current to one or more rows or columns of pixels. Current is then regulated between this power line and the lower electrode of the organic light emitting diode by one or more transistors, referred to as power transistors or drive transistors. The circuit is completed by electrically connecting the upper electrode of the organic light emitting diode to a second voltage source, such as a ground voltage. This upper electrode is frequently common to all the pixels and does not require precision, pixel level patterning or alignment.

In prior art OLED displays, the power line is formed in either of the two previously described conductor layers. The signal lines formed in each of such layers are patterned into separate, electrically isolated, features during a photolithographic patterning and an etching step. By forming the power line in one of these two metal layers which are already required to form the mesh of data lines and select lines, the power lines can be formed without any additional photolithographic patterning steps. Therefore, cost to produce the display can be kept low. The prior art power lines have been arranged in either a row direction or a column direction and can be arranged to supply electrical current to one or more of such rows or columns of pixels. Such power lines are frequently formed of metals such as aluminum, aluminum alloys such as aluminum neodymium, chromium, or molybdenum. Examples of various arrangements of these power lines can be found in U.S. Pat. Nos. 6,522,079, 6,919,681, and 6,771,028.

Prior art displays also typically employ another conductor layer formed over the two previously described conductor layers to form the lower electrodes for the OLED element. This conductor layer is, in some examples, transparent to allow transmission of the light emission and is therefore constructed of transparent conductive materials such as indium tin oxide (ITO), indium zinc oxide (IZO), aluminum zinc oxide (AZO), or the like. However, these transparent conductive materials are not as highly conductive as the materials used for the lower conductor layers, which do not have the requirement of optical transparency. Therefore, this transparent conductor layer is not well suited for carrying current across long distances of many pixels.

As display sizes increase, for example from small displays such as are useful for cellular telephones or digital cameras to large displays such as are useful for monitors or televisions, the length of these power lines and the total amount of electrical current being carried by the power lines both increase. This may result in a large electric resistance that cause large voltage variations across the power lines from the center to the edge of the display even when highly conductive materials such as aluminum are employed. These voltages variations can adversely affect the luminance uniformity of the display as well as result in wasted power consumption. One method of reducing this resistance is to increase the width of the power line as described in U.S. Pat. No. 6,762,564. Another approach to improving the current supply across the panel as described in U.S. Pat. Nos. 6,724,149 and 6,714,178 is to provide a first set of power lines in the same conductor layer as the select lines in the row direction and a second set of power lines in the same conductor layer as the data lines in the column direction and connect them together to form a grid or matrix. However, both of these approaches are limited in effectiveness since the area available for light emission is reduced when features in these two opaque conductor layers are added or increased in size. Any such reduced area for light emission requires the organic light emitting diode to be driven at higher currents, which increases power consumption and reduces display lifetime. U.S. Pat. No. 6,714,178 also suggests providing yet another highly conductive conductor layer specifically for the purpose of forming discrete power lines. This approach, however, has a disadvantage in that additional manufacturing steps are required, thereby increasing manufacturing cost. Therefore, a new OLED display device that can provide a power supply to the pixels with reduced resistance across the display while maintaining low manufacturing cost is desired.

SUMMARY OF THE INVENTION

It is an object of the present invention to provide an OLED display having reduced resistance to current flowing to the pixels. It is a further object of the present invention to provide an OLED display that can be easily fabricated without additional patterning or etching steps.

These objects are achieved an electroluminescent display device comprising:

a) a plurality of pixels for generating light emission disposed over a substrate arranged in a matrix with rows and columns wherein each pixel includes first and second electrodes, an electroluminescent media disposed between the first and second electrodes, and at least one transistor electrically connected to the first electrode to regulate an electrical current flow to the organic electroluminescent media;

b) a plurality of power lines arranged in either the row or column direction for supplying electrical current to the transistor of each pixel;

c) at least one power bypass line electrically connected to two or more of the plurality of power lines; and d) the power lines formed from a patterned first conductor layer and the first electrodes and the power bypass lines formed from a patterned second conductor layer and wherein the first and second conductor layers are spaced apart from each other.

An advantage of the present is that is provides an effect way for reducing electrical resistance from a voltage supply to the pixels of an active matrix electroluminescent display device. By reducing the electrical resistance, uniformity of the display brightness is maintained.

BRIEF DESCRIPTION OF THE DRAWINGS

Since feature dimensions such as layer thicknesses are frequently in sub-micrometer ranges, the drawings are scaled for ease of visualization rather than dimensional accuracy.

DETAILED DESCRIPTION OF THE INVENTION

Figure 3:
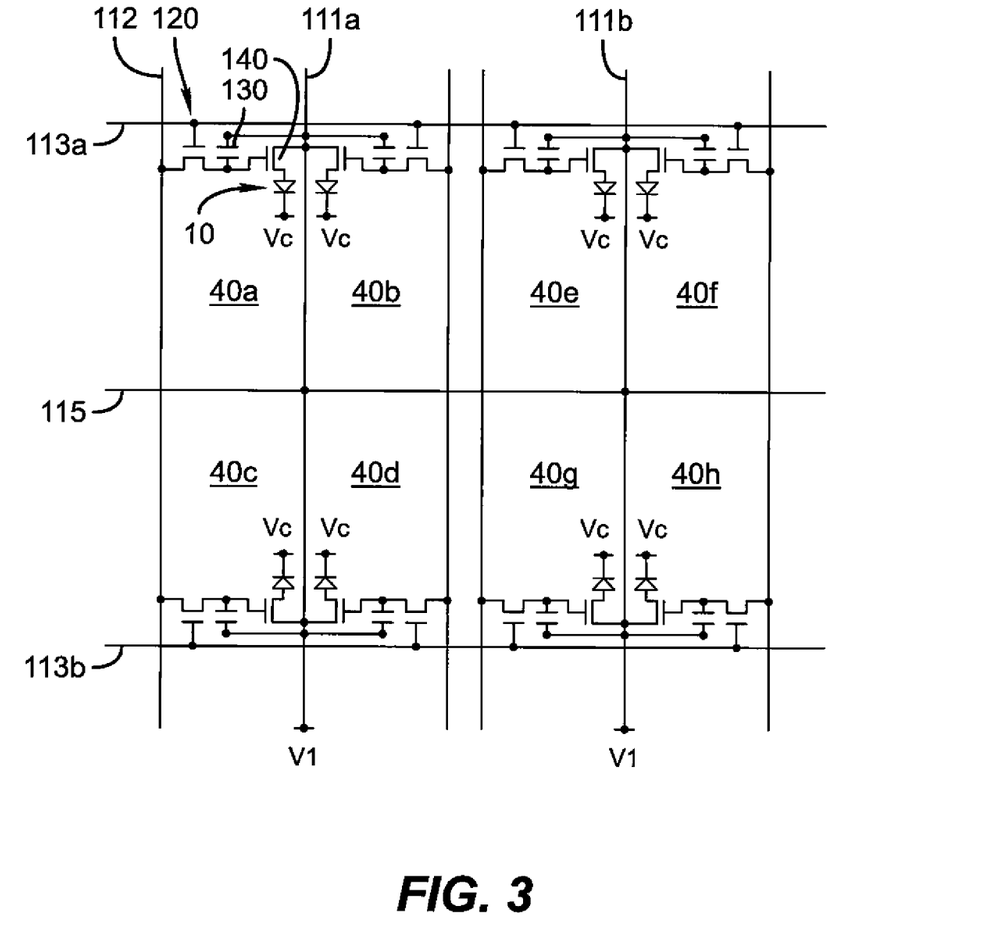
FIG. 3 depicts a circuit diagram of an OLED display device according to the present invention.

An active matrix circuit used for driving an OLED display according to the present invention is shown in FIG. 3. A matrix of two rows and two columns with a total of eight pixels (pixels 40a, 40b, 40c, 40d, 40e, 40f, 40g, and 40h) is shown for illustrative purposes, however, this design is typically expanded to a larger number of rows and columns. This circuit comprises two TFT's for each pixel, such as select transistor 120 and power transistor 140, as well as a storage capacitor 130. These components are connected to several signal lines including power line 111a, power line 111b, data line 112, select line 113a and select line 113b. These components are arranged to drive the organic light emitting diode 10 which is typically formed over and electrically connected to the circuit components formed on the substrate. Over the organic light emitting diode, an upper electrode is formed which is typically common to all the pixels and connected to a common voltage (Vc). According to the present invention, a power bypass line 115 is provided. The power bypass line provides electrical connection between power line, such as power line 111a and power line 111b as shown. By forming this mesh configuration of power lines and power bypass lines, electrical resistance to the power transistors is effectively reduced.

The operation of the active matrix circuit shown in FIG. 3 will now be described. Each row of pixels is selected in turn by applying a voltage signal to the select line associated with the row, such as select line 113a, which turns on the select transistor, such as select transistor 120, for each pixel in that row. The brightness level, or gray scale information, for each pixel is controlled by a voltage signal, which has been set on the data lines, such as data line 112. As such, the data lines, such as data line 112, are arranged perpendicular to the select lines, such as select line 113a and 113b, in the matrix. The storage capacitor, such as storage capacitor 130, for each pixel is then charged to the voltage level of the data line associated with that pixel and maintains the data voltage until the row is selected again during the next image frame. The storage capacitor 130 is connected to the gate terminal of the power transistor 140. Power transistor 140 regulates the current flow through its source and drain terminals from the power line 111a to the organic light-emitting diode 10 in response to the voltage level held on its gate terminal by storage capacitor 130, thereby controlling the pixel's brightness. Organic light-emitting diode is supplied power from power line 111a which is connected to a first voltage source through power transistor 140 and out the common upper electrode connected to the common voltage source (Vc). Each row is then unselected by applying a voltage signal to the select line, which turns off the select transistors. The data line signal values are then set to the levels desired for the next row and the select line of the next row is turned on. This is repeated for every row of pixels. During this time, storage capacitor 130 maintains the data signal on the gate of power transistor 140 such that organic light emitting diode continues to emit while the other rows are receiving data.

As such, select lines are signal lines that serve the function of isolating a row of pixels so that the gray scale information can be loaded into the pixels of the row. Select lines may alternately be referred to a gate lines are scan lines. Data lines are signal lines that provide the gray scale information to the pixels. This gray scale information can be in the form of a voltage or current signal. Data lines may alternately be referred to as source lines. Power lines are signal lines that provide a source of electrical power to the organic light-emitting diodes of the pixels for maintaining the brightness level of the pixel, at least during the time when the pixels row is not selected by the select line. Typically, the power lines provide a source of electrical power to the organic light-emitting diode at all times when the pixels are illuminated. Power lines may alternately be referred to a power supply lines.

The power bypass line 115 serves to reduce electrical resistance and therefore the voltage drop along the power lines, such as power line 111a and power line 111b by allowing current to be provided by multiple power line paths instead of from a single power line. This is particularly useful when differential driving conditions occur, such as a bright area illuminated near the center of the display surrounded by a darker field, or some columns of pixels illuminated while other columns of pixels are off.

Many different alternate types of circuit arrangements are known in the art having various arrangements and numbers of circuit components and signal lines which are constructed with signal lines serving these basic functions. These alternate arrangements include, for example, current mirror type circuits such as shown in U.S. Pat. Nos. 6,091,203, 6,501,466, 6,535,185 and 6,774,877 as well as the pixel circuits shown in U.S. Pat. No. 6,229,506 and the pixel circuit described in U.S. Patent Application Publication 2004/0222746 A1. One skilled in the art can apply these alternate circuits and similar circuits to the present invention. While the circuit of this example is shown with the organic light-emitting diode arranged in a particular bias with the cathode connected to the common connection and the anode connected to the power transistor, circuits having the opposite arrangement is also known in the art and can also be applied to the present invention. Also, while the capacitor is shown connected to the power line, other example circuit arrangements where a separate capacitor signal line is provided are known in the art and can be applied to the present invention by one skilled in the art.

Figure 1:
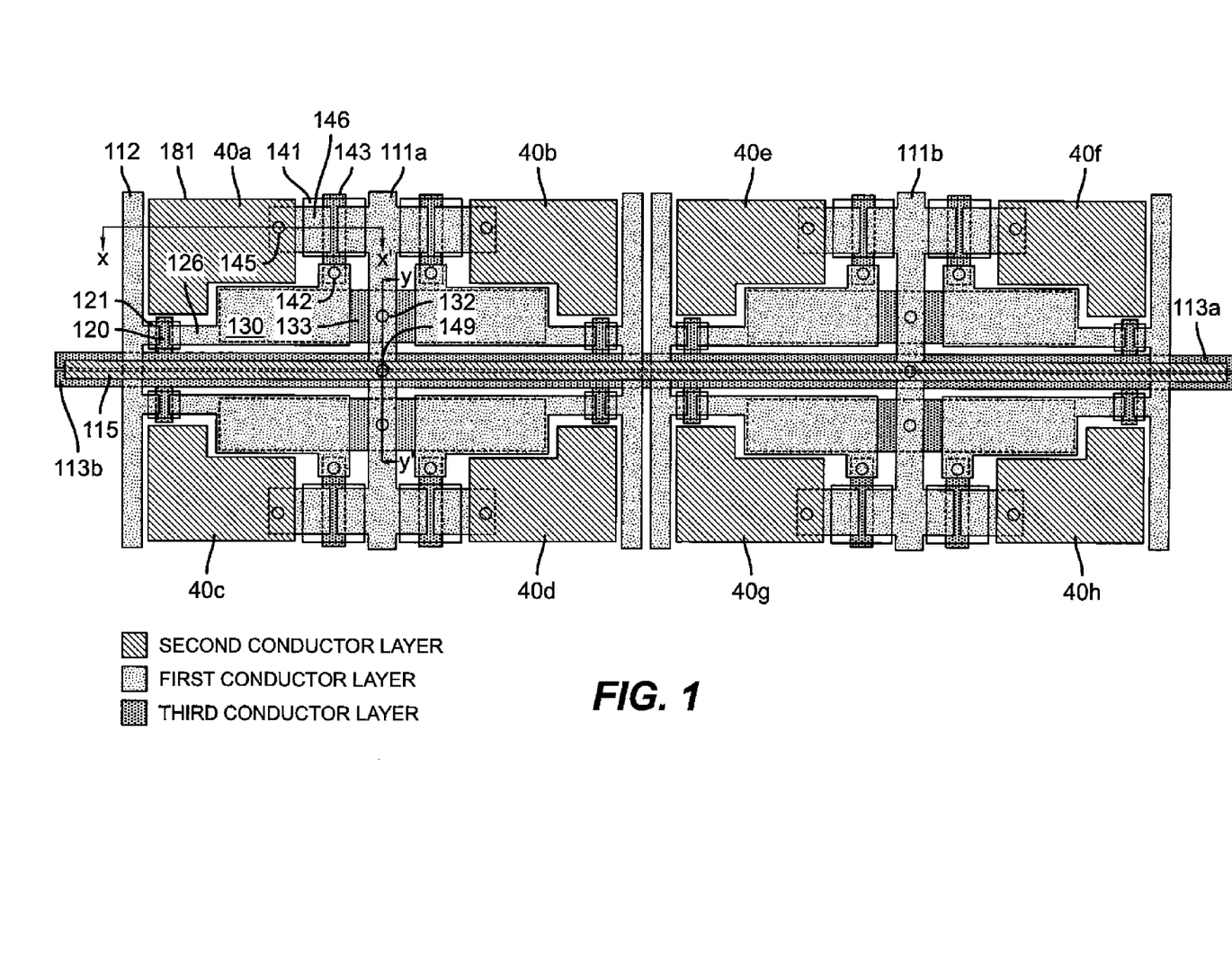
FIG. 1 depicts layout diagram illustrating the arrangement and construction of the drive circuitry components of an OLED display device according to the present invention.

The physical layout view of the circuit of FIG. 3 as implemented using amorphous silicon type TFT's is shown in FIG. 1. The construction of the various circuit components such as select transistor 120, storage capacitor 130, and power transistor 140 can be seen in FIG. 1. The drive circuitry components are fabricated using conventional integrated circuit and thin film transistor fabrication technologies. Power line 111a, power line 111b and data line 112 are formed from a patterned first conductor layer. Power bypass line 115 and lower electrode 181 are formed from a patterned second conductor layer, which is spaced apart from the first conductor layer. That is, in this example, the second conductor layer is formed over the first conductor layer and the substrate. Select line 113a and select line 113b are formed in a patterned third conductor layer. The third conductor layer is spaced apart from the first and second conductor layers. In this example, the third conductor layer is formed between the substrate and the first and second conductor layers. Forming and patterning of the first, second, and third conductor layers is well known in the art and can be accomplished by conventional deposition techniques, such as sputtering, followed by conventional photolithography and etch processes. The first, second and third conductor layers are spaced apart from one another, being formed in three different deposition steps and then patterned in three different photolithography steps. A first insulator layer, also referred to as the gate insulator layer, is formed between the first and third conductor layers in order to provide electrical isolation. This configuration allows the data lines and select lines to cross in a perpendicular fashion as shown without electrically connecting, thereby forming the matrix of pixels. Similarly, second insulator layer is also formed between the first and second conductor layers. Electrical connections between features formed in the different conductor layers are achieved by forming contact holes, or vias, through the insulator layers disposed between the conductor layers. The electrical resistance of the power lines, data lines, and select lines should be kept low. Therefore the first and third conductor layers are preferably constructed of highly conductive materials such as aluminum, aluminum alloys such as aluminum neodymium or aluminum silicon, molybdenum, chromium, or the like.

A portion of select line 113a extends to form the gate of select transistor 120. Select transistor 120 is formed from a first semiconductor region 121 using techniques well known in the art. The first semiconductor region is formed over the first insulator layer. The first terminal of select transistor 120, which can be either the source or drain terminal, is formed from a portion of data line 112. The second terminal of select transistor 120, terminal 126, is patterned from the first conductor layer and also extends to form the second capacitor electrode of storage capacitor 130 and as well as to electrically connect to the power transistor gate 143 of power transistor 140 through contact hole 142, as shown. The transistors, such as select transistor 120, are shown as bottom gate type transistors, however, other types such as top gate and dual-gate transistors are also known in the art and can be employed in the present invention by one skilled in the art. Similarly, power transistor 140 is formed from a second semiconductor region 141. The first semiconductor region 121 and second semiconductor region 141 are typically formed and patterned from a semiconductor layer over the first insulator layer. For this example of an amorphous silicon thin film transistor, the semiconductor layer is composed of multiple sub-layers such as an intrinsic, or undoped, sub-layer and a doped sub-layer. The present invention can also be practiced in embodiments where the semiconductor layer is composed of polycrystalline or crystalline silicon, or semiconductor materials other than silicon, such as organic semiconductors and metal oxide semiconductors such as zinc tin oxide. The power transistor gate 143 of power transistor 140 is patterned from the third conductor layer. The first terminal of power transistor 140 is formed from a portion of power line 111a, as shown. The second terminal 146 of power transistor 140 is patterned from the first conductor layer. Storage capacitor 130 is formed between a first capacitor electrode 133 which is patterned from the third conductor layer and the second capacitor electrode formed as a portion of terminal 126 as described above. The first insulator layer (not shown) is disposed between the first capacitor electrode and the second capacitor electrode. The first capacitor electrode 133 is electrically connected to power line 111a through contact hole 132. Alternate pixel layout configurations are known in the art where the storage capacitor is not directly connected to the power line but instead a separate capacitor line is provided, which may be maintained at a different voltage level or the same voltage level relative to the power line.

Lower electrode 181 of the organic light emitting diode is formed from the second conductor layer formed over the first and third conductor layers. A second insulator layer (not shown) is located between the lower electrode 181 and the first conductor layer. The lower electrode 181 of the organic light emitting diode is connected to power transistor 140 through contact hole 145 formed in this second insulator layer.

Lower electrode 181 serves to provide electrical contact to the organic electroluminescent media (not shown) of the organic light emitting diodes. Over the perimeter edges lower electrode 181, an inter-pixel insulator layer (not shown) may also be formed to cover the edges of the electrodes and reduce shorting defects as is known in the art. Examples of such inter-pixel insulator layers can be found in U.S. Pat. No. 6,246,179.

In a device where the light emission is viewed through the substrate, lower electrode 181 is preferably constructed of a highly transparent material such as indium tin oxide (ITO), indium zinc oxide (IZO), aluminum zinc oxide (AZO), or the like. Therefore, the second conductive layer is formed of such transparent materials. On the other hand, the first and third conductor layers, used to form the data lines, power lines, and select lines are preferably constructed of highly conductive materials, as previously described. As such, the first and third conductor layers are opaque to light emission. Therefore, the effective area for light emission is reduced by the features formed from the first and third conductor layers, such as power line 111a and data line 112.

According to the present invention, power bypass line 115 is also formed from the second conductor layer along with the lower electrode 181. As such, the power bypass line is formed in a region between light emitting areas. The power bypass line 115 is formed perpendicular to the power lines such as power line 111a and power line 111b. The power bypass line makes electrical connection to the power lines by means of contact holes such as contact hole 149 for making electrical contact to power line 111a. Electrical connection can be made to every power line as shown, or at less frequent intervals such as, for example, every second or every third power line. Since the power bypass line 115 is not formed in the first or third conductor layers, a large area for light emission can be preserved. In order to not detract from the available area for light emission, it is preferable that the power bypass line be formed, at least in part, over or overlapping other features formed of the first or third conductor layers. For example, the power bypass 115 may be formed over the gate lines such as select line 113a and select line 113b, as shown. As such the power bypass line is formed parallel to the gate lines. In this example, since the power bypass line is formed parallel to the gate lines and perpendicular to the power lines and needs to be electrically connected to the power lines, a preferable arrangement is shown in that the power lines, power bypass lines, and gate lines are formed in the first, second, and third conductor layers respectively with the first conductor layer disposed between the second and third conductor layers to facilitate making electrical connection between the power lines and the bypass lines by means of contact holes.

In the preferred case, as shown, the gate line 113a for the first row of pixel (pixels 40a, 40b, 40e, 40f) and gate line 113b for the second row of pixel (pixels 40c, 40d, 40g, 40h) are formed adjacent to each other such that these gate lines are disposed between the first electrodes of the pixels of the first row and the first electrodes of the pixels of the second row. This arrangement is advantageous because it groups the non-light emissive areas consumed by the gate lines together, such that power bypass line 115 can be disposed over both select line 113a and select line 113b and can therefore be made large without consuming additional surface area and detracting from area available for light emission. Also, this arrangement allows for one contact hole between the power bypass lines and the power lines for every two rows of pixels, such as contact hole 149 between power bypass line 115 and power line 111a serving both the first and second rows of pixels. Since these contact holes through the second insulator layer tend to have large areas, as described below, this arrangement serves to reduce the total number of contact holes required and provides a large non-emissive surface area for such contact holes thereby preserving a large surface area for light emission. Similarly, each power line in the shown preferred arrangement supplies electrical current to two columns of pixels and is disposed between the emissive areas of such columns of pixels. For example, power line 111a is arranged to supply electrical current to the first column of pixels (pixel 40a and pixel 40c) and the second column of pixels (pixel 40d and pixel 40e). This arrangement results in one contact hole between the power bypass lines and the power lines for every two columns of pixels. As such these contact holes are also arranged in rows and columns. This arrangement serves to reduce the total number of contact holes required and provides a large non-emissive surface area for such contact holes thereby preserving a large surface area for light emission. Taken together, one contact hole between the power bypass lines and the power lines is provided for every four pixels. This arrangement is particularly well suited to driving a display having four differently colored pixels, such as an RGBW (Red, Green, Blue, White) display. The present invention, however, is not limited to this preferred embodiment and other embodiments having more contact holes or fewer contact holes between the power bypass lines and the power lines, such as one contact hole for each pixel, can also be practiced by one skilled in the art.

Figure 2A:
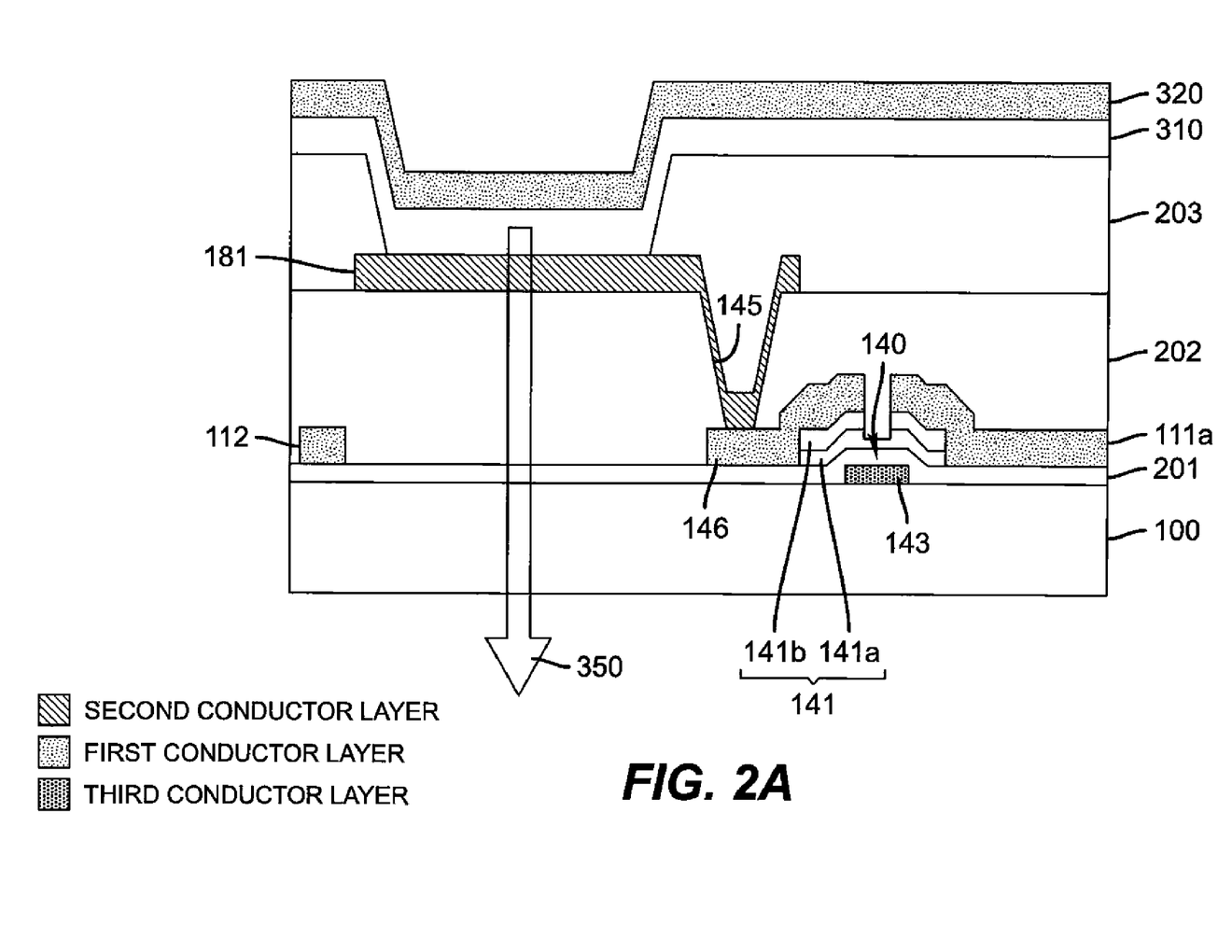
FIG. 2A-2B depicts cross sectional views of the OLED display device of FIG. 1 along lines X-X' and Y-Y'.
Figure 2B:
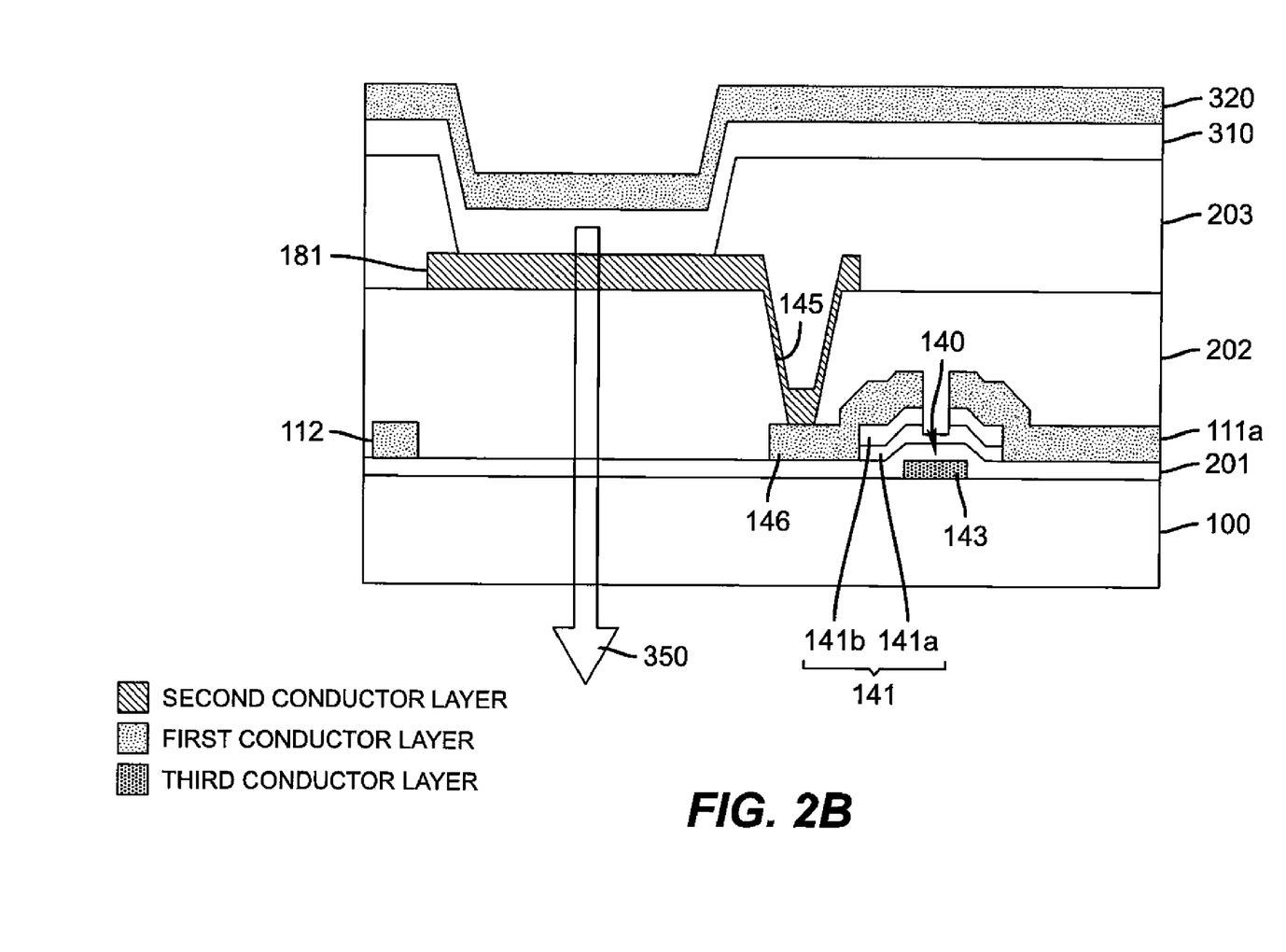

Cross-sectional illustrations of the device of FIG. 1 along line X-X' and line Y-Y' are shown in FIG. 2a and FIG. 2b, respectively. In these cross-sectional views, the position of the insulating substrate 100 as well as the positions of the first insulator layer 201 (also referred to as the gate insulator layer) and second insulator layer 202 can be seen. These insulator layers are shown as single layers but may actually comprise several sub-layers of different insulating materials. The second insulator layer 202 preferably also preferably serves a smoothing, or planarizing, function. As such it may be composed of an inorganic sub-layer such as silicon nitride followed by thicker smoothing layer composed of a materials such as an organic resin, spin-on-glass (SOG), or the like. The construction of the amorphous silicon power transistor 140 is also shown. The second semiconductor region 141 is shown with an intrinsic sub-layer 141a and doped sub-layer 141b.

The placement of inter-pixel insulator 203 over the edges of lower electrode 181 is shown in FIG. 2a. Over lower electrode 181, the organic electroluminescent media 310 is formed. Here the organic electroluminescent media 310 is shown as a single layer, but it is typically composed of a plurality of sub-layers such as a hole injecting sub-layer, hole transporting sub-layer, one or more emitting sub-layers, electron transporting sub-layer, and an electron injecting sub-layer. Various constructions and combinations of such sub-layers are known in the art. Above the organic electroluminescent media 310, the upper electrode 320 is formed. Upper electrode 320 is common to all pixels in this active matrix arrangement and serves to provide an electrical connection to the common voltage source as previously described. When electrically stimulated, the organic electroluminescent media 310 above the lower electrode 181 in the area defined by the opening of the inter-pixel insulator 203 will emit light 350. Light 350 is shown as exiting the bottom of the device (the direction through insulating substrate 100). As such, substrate 100 is preferably transparent and may be selected of glass, plastic, or other transparent materials. This configuration is known as a bottom-emitting configuration. In this configuration the upper electrode 320 is preferably reflective. As such, upper electrode 320 is can be constructed of reflective conductive materials such as aluminum or silver, magnesium silver alloys, or the like. The lower electrode is transparent in such a configuration, being constructed of materials such as indium tin oxide (ITO), indium zinc oxide (IZO), aluminum zinc oxide (AZO) or the like.

The positioning of the power bypass line 115 can be seen. As previously described, in this preferred embodiment, the power bypass line is partially over select line 113a and select line 113b. It can also be seen that power bypass line 115 is electrically connected to power line 111a through contact hole 149. The electrical connection between power line 111a and capacitor electrode 133 through contact hole 132 can also be seen. Since contact hole 149 is formed through second insulator layer 202, which is preferably thick as previously described, this contact hole tends have a tapered edge and therefore requires a large surface area. As such, it is desirable to keep the occurrences of such contact holes between the features of the first and second conductor layers low.

The invention has been described in detail with particular reference to certain preferred embodiments thereof, but it will be understood that variations and modifications can be effected within the spirit and scope of the invention.

PARTS LIST 10 light emitting diode
40a pixel
40b pixel
40c pixel
40d pixel
40e pixel
40f pixel
40g pixel
40h pixel
100 insulating substrate
111a power line
111b power line
112 data line
113a select line
113b select line
115 power bypass line
120 select transistor
121 semiconductor region
126 terminal
130 storage capacitor
132 contact hole
133 first capacitor electrode
140 power transistor
141 semiconductor region
141a intrinsic sub-layer
141b doped sub-layer
142 contact hole
143 power transistor gate
145 contact hole
146 terminal
149 contact hole
181 lower electrode
201 first insulator layer
202 second insulator layer
203 inter-pixel insulator
310 organic electroluminescent media
320 upper electrode
350 light

The invention claimed is:

1. An electroluminescent display device comprising:
a) a plurality of groups of four pixels, the pixels of each group of four pixels arranged in a first and second row and a first and second column, for generating light emission disposed over a substrate arranged in a matrix with rows and columns wherein each pixel includes first and second electrodes where the first electrode is formed in a second patterned conductor layer, an electroluminescent media disposed between the first and second electrodes, and at least one transistor electrically connected to the first electrode to regulate an electrical current flow to the organic electroluminescent media;
b) a plurality of power lines formed in a first patterned conductor layer and arranged in a column direction with each power line supplying electrical current to the transistor of each pixel of a group of four pixels;
c) at least one power bypass line formed in the second patterned conductor layer and arranged in a row direction;
d) a plurality of first and second signal lines formed in a third patterned conductor layer and arranged in the row direction for controlling the first and second rows of each group of four pixels;

e) an insulator layer disposed between the first and second conductor layers and a plurality of contact holes, one for each of the groups of four pixels, through the insulator layer wherein the power bypass line is electrically connected to the power line through a contact hole associated with each of the groups of four pixels; and f) for each group of four pixels, there is a first and second signal line disposed between the first and second rows, a power bypass line disposed at least partially over the first and second signal lines, a power line disposed between the first and second columns and a contact hole disposed between the first and second rows and between the first and second columns.

2. The electroluminescent display of claim 1 wherein the second conductor layer comprises ITO, IZO, or AZO.

3. The electroluminescent display of claim 1 wherein the substrate is transparent and the light emission is viewed through the substrate.

4. The electroluminescent display of claim 1 wherein the first conductor layer is disposed between the second conductor layer and the substrate.

5. The electroluminescent display of claim 1 wherein the transistor comprises amorphous silicon.

* * * * *